United States Patent [19]
Tatham et al.

[11] Patent Number: 5,861,970
[45] Date of Patent: Jan. 19, 1999

[54] DISPERSION COMPENSATION IN AN OPTICAL COMMUNICATIONS SYSTEM

[75] Inventors: Martin Christopher Tatham; Gerard Sherlock, both of Suffolk, United Kingdom

[73] Assignee: British Telecommunications public limited company, London, United Kingdom

[21] Appl. No.: 586,634

[22] PCT Filed: Mar. 23, 1994

[86] PCT No.: PCT/GB94/00602

§ 371 Date: Jan. 29, 1996

§ 102(e) Date: Jan. 29, 1996

[87] PCT Pub. No.: WO95/03653

PCT Pub. Date: Feb. 2, 1995

[30] Foreign Application Priority Data

Jul. 20, 1993 [GB] United Kingdom ................ 9315011.8

[51] Int. Cl.[6] .................................................. H04B 10/00
[52] U.S. Cl. .......................... 359/161; 359/134; 359/160; 359/173; 359/179
[58] Field of Search ..................................... 359/134, 160, 359/161, 173, 179, 188, 195, 341; 372/6; 330/59, 308

[56] References Cited

U.S. PATENT DOCUMENTS 5,365,362  11/1994  Gnauck et al. .......................... 359/161

FOREIGN PATENT DOCUMENTS 0314373  5/1989  European Pat. Off. ................ 359/161
4081724  3/1992  Japan .

OTHER PUBLICATIONS

Yazaki et al, "Chirping Compensation Using a Two–Section Semiconductor Laser Amplifier", Journal of Lightwave Technology, vol. 10, No. 9, Sep. 1992, New York, US, pp. 1247–1254.

Patent Abstracts of Japan, vol. 16, No. 301 (P–1379) 3 Jul. 1992 & JP A 04 081 724 (NEC).

Primary Examiner—Kinfe-Michael Negash
Attorney, Agent, or Firm—Nixon & Vanderhye P.C.

[57] ABSTRACT

A method of compensating for dispersion in an optical communications system includes the steps of: positioning a semiconductor optical amplifier between a first and a second length of optical fibre, launching optical signals into the first length of optical fibre, directing optical signals emerging from the first length of optical fibre into the semiconductor optical amplifier, supplying optical pump radiation to the semiconductor optical amplifier so that the optidcal signals and the pump radiation interact within the semiconductor optical amplifier and generate the phase conjugate of the optical signals, and launching the phase conjugate optical signals into the second length of optical fibre.

20 Claims, 11 Drawing Sheets

DISPERSION COMPENSATION IN AN OPTICAL COMMUNICATIONS SYSTEM

BACKGROUND OF THE INVENTION

1. Field of the Invention

The present invention relates to methods and apparatus for compensating for dispersion in optical communications systems, and in particular to methods and apparatus employing optical phase conjugation.

2. Related Art

In order to have a high transmission capacity, an optical communications system must have low dispersion, this means that pulses of light travelling along the waveguide, generally an optical fibre, of the optical communications system should not suffer significant distortion. This distortion may arise from a number of sources. If the optical communications system employs multi-mode fibre, each of the different modes will have a different group velocity, thus modulated signals, i.e. pulses of light passing down the multi-mode optical fibre, which are made up of a number of different modes of the waveguide will experience a different group delay from each of their modes. This causes a pulse formed from more than one mode to spread out as it propagates, and is called intermodal dispersion. Once consecutive pulses have spread out so that they are no longer distinguishable, one from the other, the information transmission limit of the optical communications system has been reached. This limit is expressed as a bandwidth distance product since it will be reached at a higher bit rate for a shorter optical communications link. Intermodal dispersion between the modes of multi-mode fibres is one of the reasons why modern optical communications systems have moved to the use of single mode optical fibre which, since it only supports one optical mode, does not suffer from intermodal dispersion.

However single mode optical communications systems do suffer from pulse spreading due to the small, but finite bandwidth of the optical source employed. This type of pulse spreading is called chromatic dispersion, and is due to two effects. Firstly, material dispersion is present because the refractive index of a dispersive medium, such as silica from which optical fibres are typically made, depends on wavelength. Secondly, waveguide dispersion, since the propagation characteristics of the single mode supported by a single mode fibre also depend on wavelength. Since the material dispersion of silica is positive at most wavelengths of interest for optical communications systems, and the waveguide dispersion for single mode fibres is negative, these two effects can be carefully balanced in a well designed optical fibre so as to Vive zero total, chromatic dispersion at the operating wavelength of the optical communications system.

The vast majority of optical communications systems which have been installed worldwide contain single mode optical fibre which has been designed for use in the 1.3 $\mu$m low loss window, and as such has low chromatic dispersion at this wavelength. In recent years the rapid development of erbium doped fibre amplifiers (EDFA) has meant that fibre loss, and thus the power budget of optical communications systems, is no longer the fundamental limit to achievable transmission distance. However these EDFAs are only operable in the 1.55 $\mu$m optical transmission window so that if existing optical communication links are to be upgraded, for example to operate at higher bit rates, these systems must operate in the 1.55 $\mu$m window, over optical fibre designed for use at 1.3 $\mu$m. Thus the fundamental bandwidth distance product transmission limit when upgrading an existing optical communications system is that imposed by dispersion. Furthermore, even for systems having fibre designed for use at 1.55 $\mu$m, as very high bit rates are approached, unless very narrow linewidth, externally modulated lasers are employed, dispersion again is the fundamental limit to transmission capacity.

A number of methods of compensating for dispersion are known. In one such technique the optical signal, at the transmitter end of the optical communications system, is deliberately distorted before being launched into the optical fibre. The distortion imposed upon the optical signal must be calculated so as to be compensated by the dispersion that the optical signal subsequently suffers during propagation along the optimal fibre. An example of such a technique is that disclose& by Koch and Alferness in "Dispersion Compensation By Active Predistorted Signals Synthesis" Journal of Lightwave Technology, volume LT-3, no. 4, August 1985. In order to successfully apply these techniques the transmission characteristics of the particular optical fibre employed, and the length of the transmission link need to be known so that the predistorted signal can be correctly synthenised. Generally the optical source employed in these systems needs to be sophisticated, and thus complex, so at to allow independent control of the amplitude and frequency of the optical signal. The problems inherent in predistortion dispersion compensation systems are considerably exacerbated for higher bit rate systems, where indeed dispersion compensation is of greatest importance.

In a second, known dispersion compensation technique a negative dispersion optical fibre is employed to compensate either at the transmission end, or at the receiver end of the optical link for the positive dispersion suffered by optical signals propagating along the transmission optical fibre. When optical signals at 1.55 $\mu$m are transmitted along a transmission optical fibre having a dispersion zero at 1.31 $\mu$m, the signals will suffer positive dispersion i.e. the sign of the differential of their group delay with wavelength, will be positive, and will typically be of the order of 17 ps/km/nm. Single mode optical fibre can be specifically designed to have a large negative chromatic dispersion, by choosing the waveguide parameters to give large negative waveguide dispersion, for example a fibre having a core of small diameter and high refractive index will have negative waveguide dispersion. Such a scheme was employed by Izadpanah et al in "Dispersion Compensation In 1310 nm Optimised SMFs Using Optical Equaliser Fibre, EDFAs And 1310/1550 nm WDM" Electronics Letters, 16 Jul. 1992, volume 28, no. 15, page 1469. Izadpanah et al employed a specially designed negative dispersion fibre having a dispersion of –45 ps/km/nm. The length of negative dispersion fibre required was approximately one third of the length of the transmission link over which dispersion was being compensated. Such large lengths of additional fibre are clearly inconvenient and expensive. Furthermore due to the high level of doping used in the core, and the small core size this fibre had a relatively high loss, so that amplification of the optical signal is essential, even if the bit rate of the system is not increased.

A third form of dispersion compensation has been theoretically proposed by Yariv et al in "Compensation For Channel Dispersion By Non-linear Optical Phase Conjugation" Optics Letters, volume 4, no. 2, February 1979. Yariv et al proposed that by generating an optical phase conjugate replica of the optical signal after it has passed through one half of the optical transmission link, and launching this phase conjugate replica into the second half of the optical transmission link, the effects of the dispersion suffered by the optical signal in the first half of the link will be reversed and the optical signal will be restored to its original shape. This technique relies on the time inversion of the group velocity dispersion of the optical signal caused by phase conjugation, and thus requires that the dispersion in the second half of the optical transmission link is the same as the dispersion in the first half, it it is to be fully compensated for.

Yariv's proposal has been implemented in an optical communications system by employing non-degenerate four wave mixing (NDFWM) in dispersion shifted fibre (DSF) to provide the necessary optical phase conjugation. In this case the phase conjugate optical signals travel in the same direction as the copropagating pump light and original optical signal. This technique has been demonstrated by Watanabe et al in "Compensation Of Chromatic Dispersion In A Single Mode Fibre BY Optical Phase Conjugation" IEEE Photonics Technology Letters, volume 5, no. 1, January 1993 and by Jopson et al in "Compensation Of Fibre Chromatic Dispersion By Spectral Inversion" Electronics Letters, 1 Apr. 1993, volume 29, no. 7. In both cases long lengths, over 20 km, of carefully designed DSF were required. A DSF is a fibre which has been designed to have zero dispersion in the 1.55 μm telecommunications window, i.e. its dispersion zero has been shifted from 1.3 μm to around 1.55 μm. In addition to this requirement, Watanabe and Jopson furthermore needed to arrange for the wavelength of the pump light required for NDFWM in the DSF to be the same as the zero dispersion wavelength of the DSF, in order to achieve sufficient phase matching between the pump and the optical signals. This requirement for phase matching over the 20 km of the DSF is severe, and means that the wavelength of the pump light must be carefully controlled e.g. over 20 km with a pump and signal separation of 2 nm the pump wavelength must be within approximately 1 nm of the dispersion zero wavelength. Furthermore this requirement becomes more severe as the length of the DSF increases, and rapidly more severe as the wavelength separation of the pump and signal is increased. The efficiency of conversion of the optical signal to its phase conjugate replica achieved by both Watanabe and Jopson is low, approximately −25 dB in both cases. Thus the phase conjugate signal to be launched into the second half of the optical transmission link is at a very low level.

It has been suggested by Murata et al in "THz Optical Frequency Conversion Of 1 Gb/s Signals Using Highly Non-degenerate Four Wave Mixing In An InGaAsP Semiconductor Laser" IEEE Transactions Photonics Technology Letters, volume 3, no. 11, November 1991, that Yariv's phase conjugation technique for dispersion compensation could be implemented by employing a semiconductor Fabry-Perot laser as the phase conjugating device. This suggestion has not, however been demonstrated.

Another known technique for dispersion compensation is described in "Chirping Compensation Using a Two-Section Semiconductor Laser Amplifier"—Journal of Lightwave Technology, vol. 10, no. 9, September 1992, pages 1247–1254.

SUMMARY OF THE INVENTION

The present invention provides a method of compensating for dispersion in an optical communications system, the method comprising the steps of i) positioning a semiconductor optical amplifier between a first and a second length of optical fibre, ii) launching optical signals into the first length of optical fibre, iii) directing optical signals emerging from the first length of optical fibre into the semiconductor optical amplifier, iv) supplying optical pump radiation to the semiconductor optical amplifier so that the optical signals and the pump radiation within the semiconductor optical amplifier generate the phase conjugate of the optical signals, and v) launching the phase conjugate optical signals into the second length of optical fibre.

The method of the present invention thus overcomes the disadvantages inherent in using DSF to provide optical phase conjugation, by employing a semiconductor optical amplifier. These devices are of a short length, of order one hundred microns, so that phase matching between the pump radiation and the optical signal is easily achieved. Since semiconductor optical amplifiers have gain, the efficiency of the optical phase conjugation process is far higher than for passive DSFs.

The applicants have surprisingly found the method of the present invention successful in compensation for dispersion in optical communications systems, despite the fact that there is substantially no cavity enhancement of the optical phase conjugation in a semiconductor optical amplifier. The theoretical suggestion by Murata et al leads the skilled man to expect that substantial cavity enhancement of the four wave mixing process by a resonant structure, for example a Fabry-Perot laser, is essential to the achievement of sufficient optical phase conjugation efficiency. The applicants have discovered, not only that this is not the case, but that there are significant advantages in employing a semiconductor optical amplifier rather than a semiconductor laser. When a significant degree of cavity, or resonance, enhancement is employed the pump and optical signal must both be accurately controlled in wavelength so that they are coincident with one of the cavity modes, thus requiring accurate wavelength control over these signals. The pump radiation wavelength in particular must coincide with that of one of the cavity modes of the Fabry-Perot laser to injection lock it, and these modes typically have an injection locking bandwidth of only a few GHz. Furthermore the use of resonance enhancement inherently places a limitation on the modulation bandwidth that can be imposed on the optical signal. This is because if the bandwidth of the optical signal begins to approach the bandwidth of the cavity resonance, the cavity resonance will act as a spectral filter to the optical signal, causing distortion of the modulation pattern of the optical signal. This effect will become more severe as the modulation bandwidth of the optical signal increases, and particularly far more severe if the optical signals are not transform-limited, for example if the transmitter has significant linewidth or suffers from chirp. A further disadvantage, inherent to all resonant devices, is their instability under temperature variations or mechanical vibration.

Preferably a semiconductor optical amplifier employed in the method of the present invention has a variation in gain with wavelength, caused by facet reflections, of less than 5 dB i.e. the amplitude of the so called "gain ripple" is less than 5 dB. The Applicants have determined that semiconductor optical amplifiers having a gain ripple less than 5 dBs will not suffer substantially from the disadvantages of cavity enhancement, for example the optical signal bandwidth restriction discussed above. As will be described hereinafter such semiconductor optical amplifiers do, however, benefit to a small degree from some cavity enhancement.

Preferably the semiconductor optical amplifier employed in the present invention has facet reflectivities of less than $10^{-3}$. This effectively ensures that, for single pass gains of up to 20 dB, the semiconductor optical amplifier is a travelling wave amplifier, having no cavity enhancement.

Preferably the wavelength of the optical signal and the wavelength of the pump radiation are separated by at least 1 nm. This ensures that the four wave mixing undergone by the optical signals and the pump radiation is highly non-degenerate. This is desirable since highly non-degenerate FWM (NDFWM) is based on an ultra-fast intraband optical non-linear gain process which has a very short response time, less than 1 ps, and thus allows the present wavelength dispersion compensation technique to be applicable to optical communications systems operating at bit rates up to tera bits per second.

Advantageously the gain of the semiconductor optical amplifier is saturated by the pump radiation. The applicants have surprisingly discovered that operating the semiconductor optical amplifier under saturation increases the ratio of the phase conjugated signal to the background spontaneous emission.

In addition, or alternatively, the semiconductor optical amplifier is advantageously operated with a high injection current. Although both the level of the phase conjugated optical signals, and the background spontaneous emission increase with increasing injection current, it has been found that the rate of increase in the level of the phase conjugated optical signal is greater than that of the background spontaneous emission, so that the signal to background ratio may be increased by increasing the injection current.

Although the optical pump radiation may be supplied to the semiconductor optical amplifier via the first length of optical fibre, advantageously the optical pump radiation is supplied to the semiconductor optical amplifier from an optical pump source co-located with the semiconductor optical amplifier. This arrangement ensures that the optical pump radiation does not suffer, for example from Brillouin scattering in the first optical fibre.

Advantageously, the optical pump radiation supplied to the semiconductor optical amplifier is generated within the semiconductor optical amplifier. This may be achieved, for example, if both the semiconductor optical amplifier and the optical pump source are comprised by a semiconductor device having wavelength selective feedback means, for example a distributed feedback (DFB) laser, or a distributed Bragg reflector laser. In this case the pump radiation for four wave mixing, rather than being supplied to the semiconductor optical amplifier from an optical pump source distinct from the semiconductor optical amplifier, is generated by the interaction of the wavelength selective feedback means with the gain medium of the semiconductor optical amplifier. Thus, in this case, a single semiconductor device, for example a DFB laser, acts as both a source of narrow linewidth pump radiation, and the non-linear medium in which four wave mixing occurs. Hence only the optical signals are injected into the single semiconductor device, and the phase conjugated optical signals are extracted from the semiconductor device. Preferably the wavelength selective feedback means provide strong optical feedback only at the pump wavelength, so as to avoid causing spectral filtering of the optical signals, or the phase conjugate optical signals.

According to a second aspect of the present invention there is provided an optical communications system comprising a transmission path including a first optical fibre and a second optical fibre, an optical signal source fox launching optical signals into the first optical fibre, an optical pump source for generating pump radiation, and a semiconductor optical amplifier having an input from the first optical fibre and an output to the second optical fibre, wherein, in use, the semiconductor optical amplifier receives the pump radiation and the optical signals, after said signals have propagated through the first optical fibre, and generates phase conjugate replicas of the optical signals, which replicas are launched into the second optical fibre.

According to a third aspect of the present invention a semiconductor optical amplifier is used to provide phase conjugation of optical signals in an optical communication link and thereby to substantially compensate for dispersion suffered by the optical signals during propagation along the optical communications link.

BRIEF DESCRIPTION OF THE DRAWINGS

Embodiments of the present invention will now be described, by way of example only, with reference to the accompanying figures, in which

FIG. 8(a) shows an alternate embodiment of the FIG. 8 arrangement;

DETAILED DESCRIPTION OF EXEMPLARY EMBODIMENTS

The applicants have carried out experiments, and a theoretical analysis, to determine the effect of cavity enhancement on NDFWM. These experiments and analysis will first be described, followed by a description of an optical communications system according to an embodiment of the present invention.

Figure 1A:
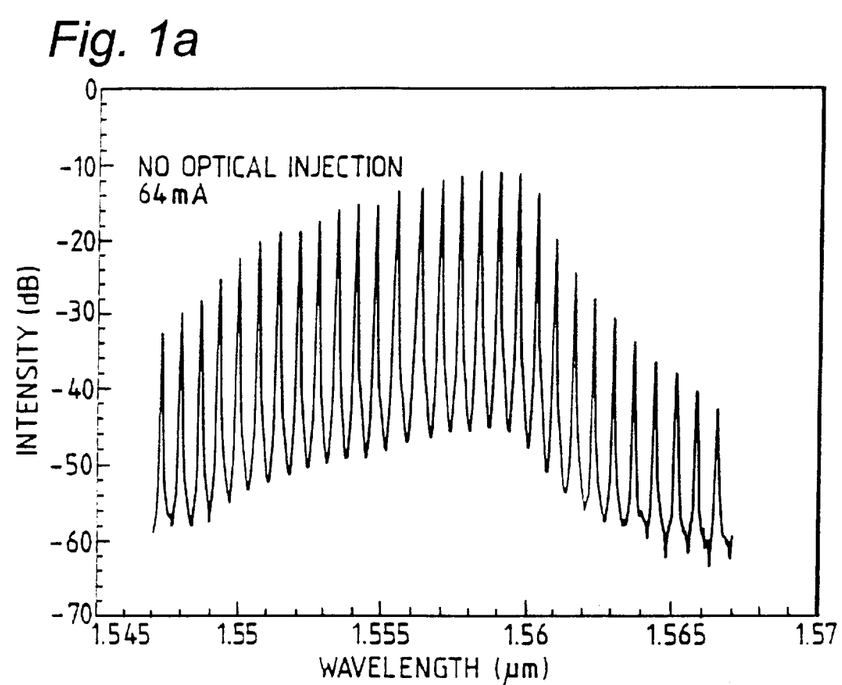
FIG. 1(a) shows the output spectrum of a 500 μm Fabry-Perot laser with the laser free-running, with 64 mA injection current.
Figure 1B:
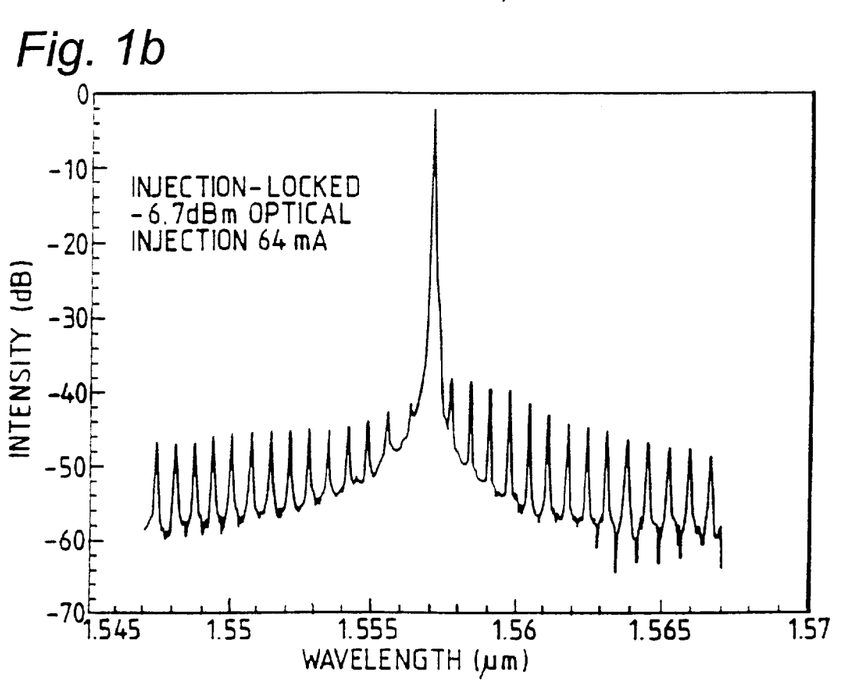
FIG. 1(b) shows the injection-locked spectrum of the same laser with −6.7 dBm light coupled into the device from an LEC laser operating at 1.557249 μm.

A number of experiments have been carried out with Fabry-Perot lasers i.e. devices having very high levels of cavity enhancement, by injecting two signals, a pump and a probe into these lasers, and tuning the wavelength of the pump and the probe across the Fabry-Perot (FP) resonances of the lasers. FIG. 1a shows the output spectrum from a 500 $\mu$m Fabry-Perot laser, having 16 multiple quantum wells (MQW), when the laser is free running, with 64 mA injection current. It can be seen from this figure that the output on resonance is some 30 dBs greater than off resonances. FIG. 1b shows the output spectrum from the same Fabry-Perot laser following injection locking with −6.7 dBm light from the tunable pump source.

Figure 2A:
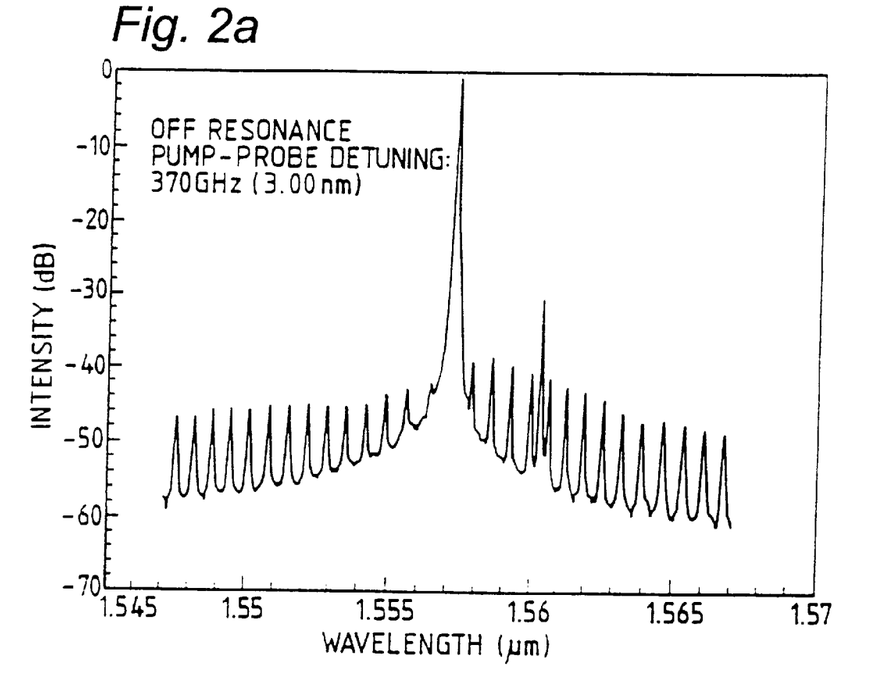
FIGS. 2(a) and 2(b) show non-degenerate four-wave mixing in an injection locked Fabry-Perot laser around the 5th resonance, (a) shows the spectrum off-resonance, with the probe laser wavelength between two FP modes, (b) shows the spectrum on resonance, with the probe laser wavelength tuned to the peak of the FP resonance.
Figure 2B:
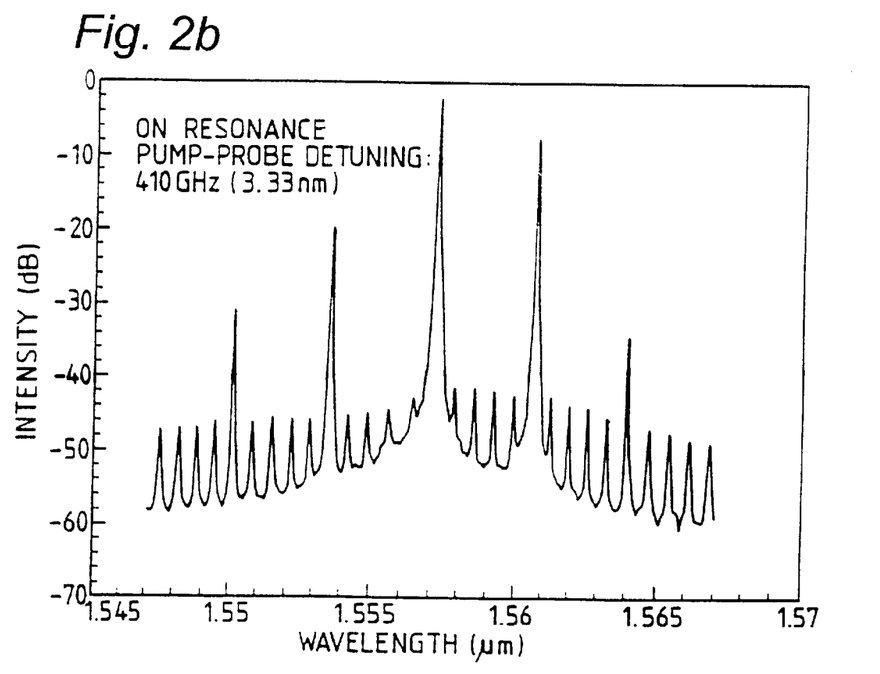
Figure 3A:
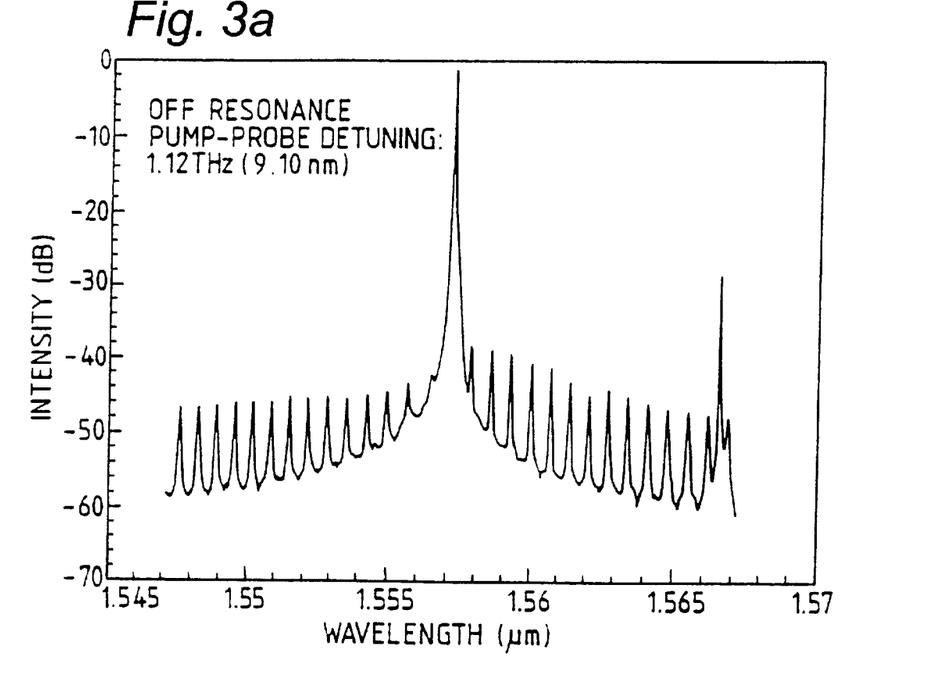
FIGS. 3(a) and 3(b) show non-degenerate four-wave mixing in an injection locked Fabry-Perot laser around the 14th resonance, (a) shows the spectrum off-resonance, (b) shows the spectrum on resonance.
Figure 3B:
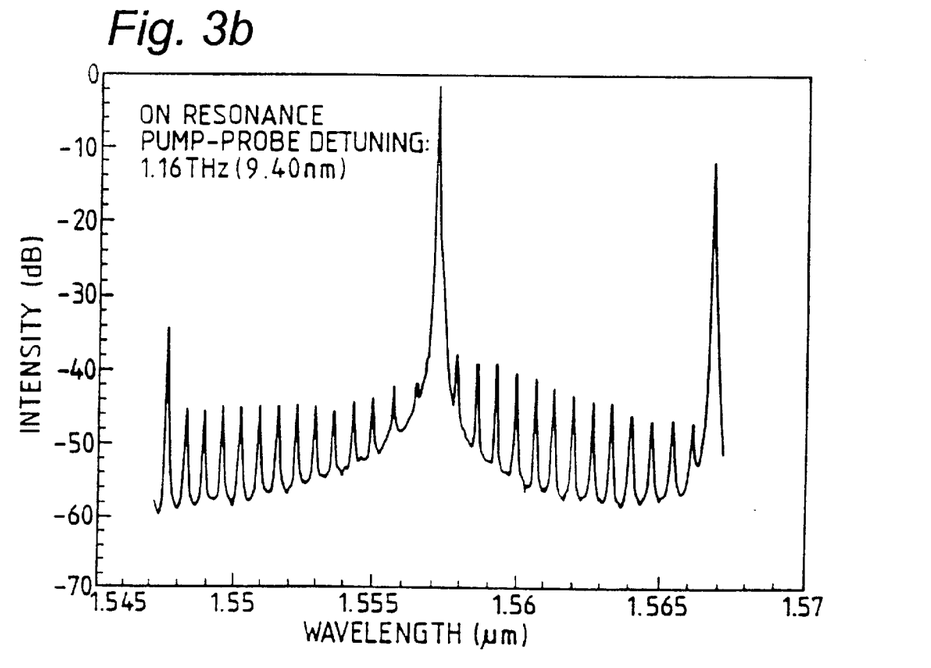

Light from the probe source was coupled into the Fabry-Perot laser, maintaining the input power constant at −13.6 dBm (coupled-in power). With the wavelength of the pump maintained at 1.557249 $\mu$m, the wavelength of the probe was tuned through the FP resonances of the pump to longer wavelengths, with up to 9.7 nm (1.19 Thz) detuning between the two inputs. Output spectra with two inputs are shown in FIGS. 2(a) & 2(b) (for ~3 nm, 370 GHz detuning between the pump and probe and in FIGS. 3(a) & 3(b) (for ~9 nm, 1.1 THz detuning); in both cases FIG. (a) shows the spectrum off resonance and (b) the spectrum on resonance. The effect of the cavity FP resonances on the NDFWM is, qualitatively, very clear: when the wavelength of the probe lies in between two FP resonances (off resonance), no conjugate signals could be observed, but tuning the probe to the peak of the FP resonance causes a dramatic increase in the conjugate beam power.

Figure 4A:
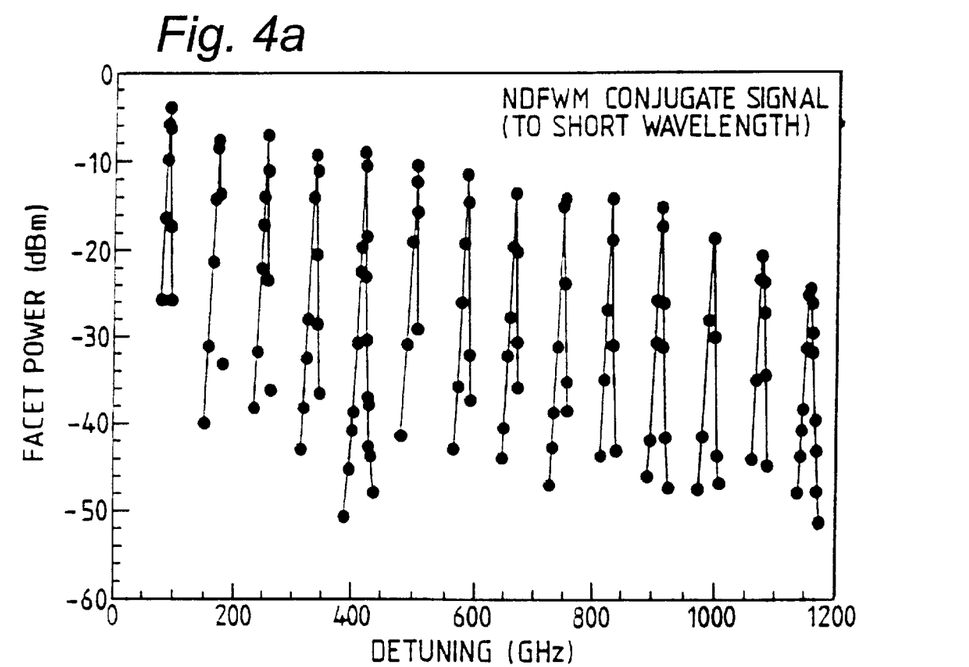
FIGS. 4(a) and 4(b) show resonance profiles for (a) the NDFWM conjugate signal, and (b) the probe laser signal, in an injection-locked Fabry-Perot laser.
Figure 4B:
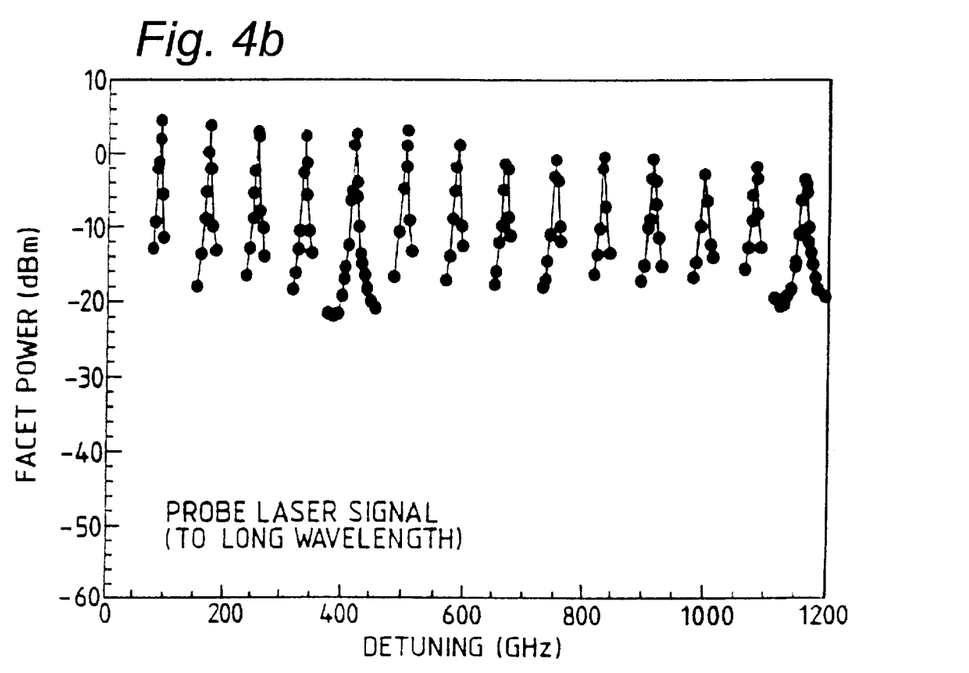

The optical power in the NDFWM conjugate beam (to shorter wavelengths) and the probe laser outputs are shown in FIGS. 4(a) & 4(b), respectively, as a function of the pump-probe detuning. The powers were determined from the measured spectra, but the system was calibrated to obtain actual facet powers. Both the conjugate and probe beams show resonances, corresponding to each of the 14 FP resonances, with narrow linewidth. Though the peak-to-trough ratios for the probe beam resonances are approximately equal to those of the residual FP modes of the FP laser spectrum, the magnitude of the conjugate beam resonances correspond to the square of these amplitudes.

Figure 5:
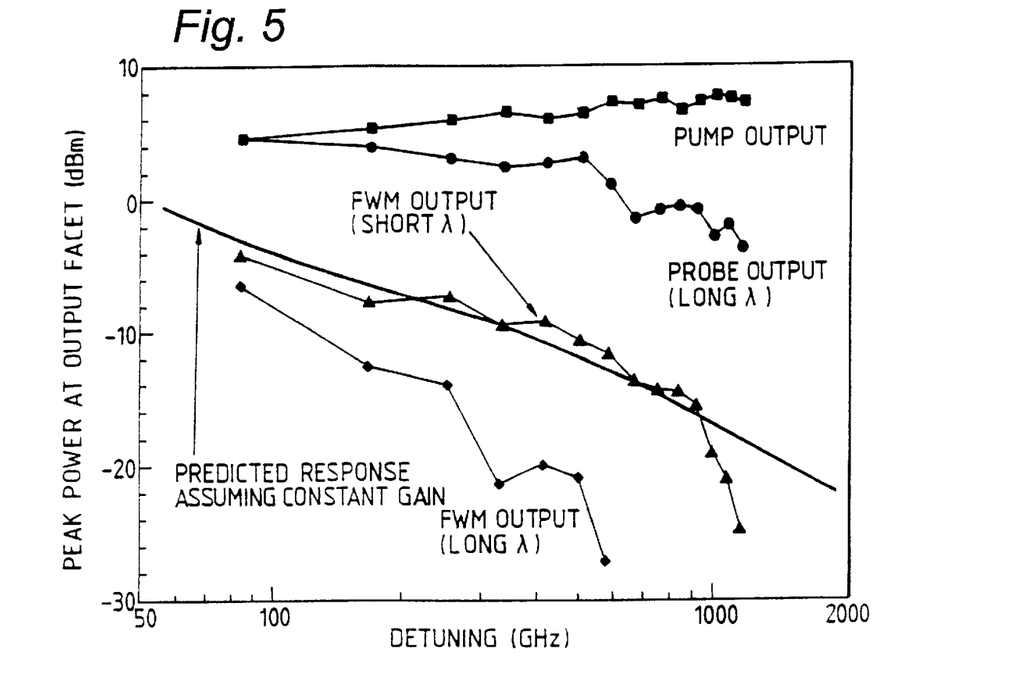
FIG. 5 shows facet output powers, from a FP laser, of the pump, probe and NDFWM conjugate signals (to short and long wavelengths) at the peak of each resonance, as a function of the pump probe detuning.

The optical powers of the pump, probe and NDFWM conjugate beams (to both longer and shorter wavelengths) at the peak of the resonances is shown in FIG. 5. The most important feature of the figure is the roll-off of the power of the short wavelength conjugate beam. For detunings of up to 0.9 THz (7.2 nm) the conjugate beam strength decreases at the rate of approximately 10 dB/decade. Above 0.9 THz (7.2 nm) the conjugate beam strength decreases at the rate of approximately 100 db/decade. Above 0.9 THz there is a much more rapid drop in optical power. The absolute power level of the conjugate beam is at least an order of magnitude higher than measured in similar experiments on travelling wave amplifiers for similar input powers. In fact, for detunings up to −0.6 THz (4.8 nm) the power of the conjugate beam at the output facet is higher than the injected power in the probe beam.

The solid line shows the theoretically predicted NDFWM gain (arbitrary scale) given by:

$$gFWM(\omega) \alpha \left| \frac{P_{sat}/(P + P_{sat})}{1 - i\omega\tau R} + \frac{\epsilon NL}{1 - i\omega\tau_{in}} \right|^2 \quad (1)$$

where $P_{sat}$ is the gain saturation power of the amplifier and P is the total optical power, $\epsilon NL$ is the non-linear gain parameter, $\omega$ is the pump-probe detuning, $\tau R$ and $\tau_{in}$ are the characteristic times of the physical processes giving rise to the two terms, that is, carrier density 'population pulsations' and non-linear gain. $\tau R$ is the effective recombination life-line (including stimulated emission), and $\tau_{in}$ is the intraband relaxation time. The theoretical curve shown gave a good fit to the experimental data for a 16-well strained layer travelling wave amplifier under similar experimental conditions, with parameters, $\tau R=0.08$ ns and $\tau_{in}=0.5$ ps. The curve gives a reasonable fit to the data for detunings up to 0.9 THz, the relatively slow decay (~10 dB/decade) arising from the combination of the fast decay (20 dB/decade) of the NDFWM due to population pulsations ($\omega>>1/\tau R$), and the almost constant level of NDFWM from non-linear gain ($\omega \leq 1/\tau R$).

The rapid decay of the conjugate signal for frequencies above 0.9 THz is due to two effects: (1) the broadening of the resonance resulting from reduced modal gain, and (2) the dispersion of the mode index, resulting in a varying FP mode spacing. Since the enhancement in the conjugate beam power results from the coincidence of both the probe and conjugate beams with FP resonances, the latter effect results in the two beams not being at resonance simultaneously. This effect appears to be dominant, since effect (1) would result in a sharp reduction in the probe output power beyond 0.9 THz detuning, which is not observed.

In order to quantify the enhancement in NDFWM efficiency resulting from cavity resonances, the results described in the previous section will be compared with results on travelling wave amplifiers (TWAs) and DFB lasers. For the TWAs, a pump and a probe beam were injected into a device which had been anti-reflection coated on both facets to $\leq 0.2\%$; the devices gave high single-peas gain (~20 dB) with <2 dB residual Fabry-Perot ripple. For the DFB, a single probe input was injected into the device, which was operated well above threshold, emitting >10 mW power.

It is necessary, however, to compare the results in a way which removes the dependence on experimental details, e.g. input powers and single-pass gain. Since the power in the conjugate beam is, in general, described by the relation $P_{fWM} \propto P_1^2 P_2$, where $P_1$, $P_2$, $P_{fWM}$ are the optical powers of the pump, probe and FWM conjugate beams, coefficients $\eta_{out}$ and $\eta_{in}$ are defined for the purposes of comparison in the following way:

$$P_{FWM\ out} = \eta_{out}(P_{1'\ out})^2 \cdot P_{2'\ out} \quad (2)$$

$$P_{FWM\ out} = \eta_{in}(P_{1'\ in})^2 \cdot P_{2'\ in} \quad (3)$$

where the subscripts 'out' and 'in' denote whether the power is the output facet power or the coupled-in input power, $\eta_{in}$ indicates the basic efficiency of a device for phase conjugation, through this will depend on the single-pass gain at which the device is operated. $\eta_{out}$ gives a better indication of the intrinsic efficiency of each type of device, since this removes the dependence on single-pass gain, and therefore will more clearly show the effect of FP cavity resonances. Table 1 shows the values of $\eta_{out}$ and $\eta_{in}$ for 1 THz pump-probe detuning, for five measurements. Devices numbered 1, 2 and 3 are two facet anti-reflection coated amplifiers, device 4 is a DFB lasers and device 5 is a Fabry-Perot laser. (In all the measurements, the weaker probe beam was to longer wavelength of the pump beam).

|   | Type | Coupled Input Powers | | ($\dot\eta_{out}$/mW$^2$) | ($\dot\eta_{in}$/mW$^2$) |
|---|---|---|---|---|---|
|   |   | P1 (dBm) | P2 (dBm) | (dB) | (dB) |
| 1 | 2FC Amplifier | −4.5 | −9.2 | −62.2 | −14.2 |
| 2 | 2FC Amplifier | −6.1 | −10.1 | −56.6 | −2.6 |
| 3 | 2FC Amplifier | −7.7 | −12.2 | −56.1 | −2.1 |
| 4 | 3-Section DFB | — −9.3 |   | −60.7 | — |
| 5 | Uncoated, Injection-Locked | −6.7 |   | −30.7 | +7.7 |

The most remarkable feature of the table is that, while the values of $\eta_{out}$ for the TWA and DFB measurements are relatively uniform, the value for the FP device at resonance is ~30 dB greater. This indicates that the effect of the FP cavity is to give roughly three orders of magnitude enhancement in the NDFWM efficiency. There is considerably less difference in the values of $\eta_{in}$ owing to the much lower gain in the F-P device, though as expected, there is less uniformity for the TWA and DFB results.

Figure 6A:
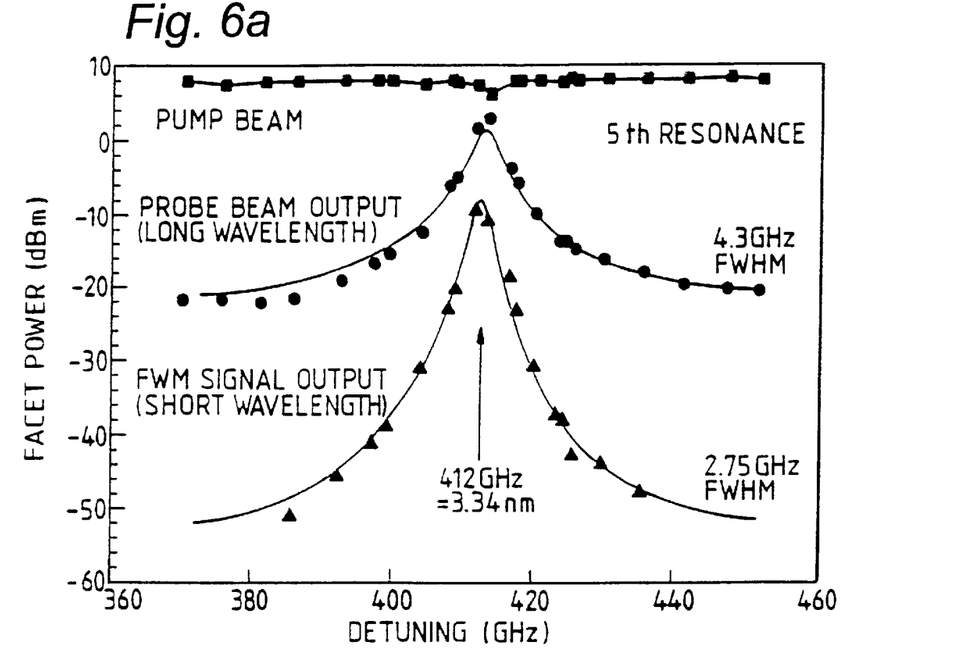
FIGS. 6(a) and 6(b) show resonance lineshapes for a FP laser for the pump, probe and NDFWM conjugate signal (short wavelength) for (a) the 5th and (b) the 14th resonance away from the FP resonance at which the pump is injected, the abscissae showing the pump-probe detuning frequencies.
Figure 6B:
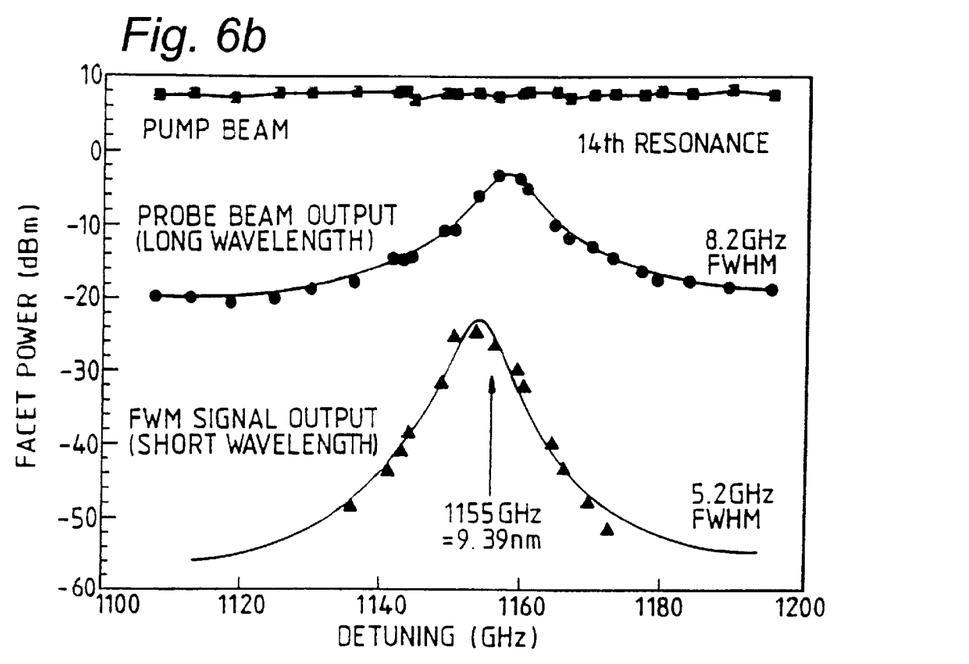

The results shown in FIG. 4 reveal that the resonance enhancement in the NDFWM occurs over a narrow bandwidth, and this imposes a severe limitation on the use of the effect, both with regard to the maximum bit rates and to the ease of use. The output intensities of the pump, probe and conjugate beam (short wavelength) for a small range of detunings around the resonance are shown in FIG. 6 for (a) the 5th resonance and (b) the 14th resonance. The experimental points for the probe and conjugate beams are fitted using the following Airy-like functions:

$$I_{pr}=I_{pr,0}\{[1-RG]^2+4\,RG\sin^2(\Delta k.L)\}^{-1} \quad (4)$$

$$I_{FWM}=I_{FWM,0}\{[1-RG]^2+4\,RG\sin^2(\Delta k.L)\}^{-2} \quad (5)$$

where $RG=\sqrt{(R_1R_2)}.\exp(gL)$ and $R_1,R_2$ are the facet reflectivities, g is the single-pass gain and L is the device length. $\Delta k$ is the wavevector detuning from the FP resonance, and $\Delta k.L=\pi(\Delta f/\Delta f_{FSR})$ where $\Delta f$ is the frequency detuning and $\Delta f_{FSR}$ is the free spectral range of the FP modes. Equations (4) and (5) are obtained assuming equal, uniform modal gain and effective index for probe and conjugate beams, and uniform pump power.

The parameter RG indicates the degree of feedback within the Fabry-Perot cavity, and in particular the magnitude of the gain ripple (i.e. ratio of the maximum to minimum gain over one cavity mode) in the amplifier is given by $$\text{Gain Ripple}=\frac{(1+RG)^2}{(1-RG)^2}$$

In both figures, the probe and conjugate beam resonance lineshapes were fitted using the same value of RG (the only variable parameter, apart from the peak intensity), and the measured value of 82.4 GHz was used for $\Delta f_{FSR}$. The full-width at half maximum intensity (FWHM) for the probe and conjugate signals was found to be 4.3 GHz and 2.8 GHz respectively for the 5th resonance; the resonance bandwidth for the 14th resonance was substantially broader, with FWHM values of 8.2 GHz and 5.2 GHz for the probe and conjugate signals respectively. For the 14th resonance, there is also significant difference of 4–5 GHz in the resonance peak positions for the probe and conjugate signals, which support the conclusion drawn previously that the modal dispersion degrades the cavity enhancement at detunings of $\geq 1$ THz.

Figure 7:
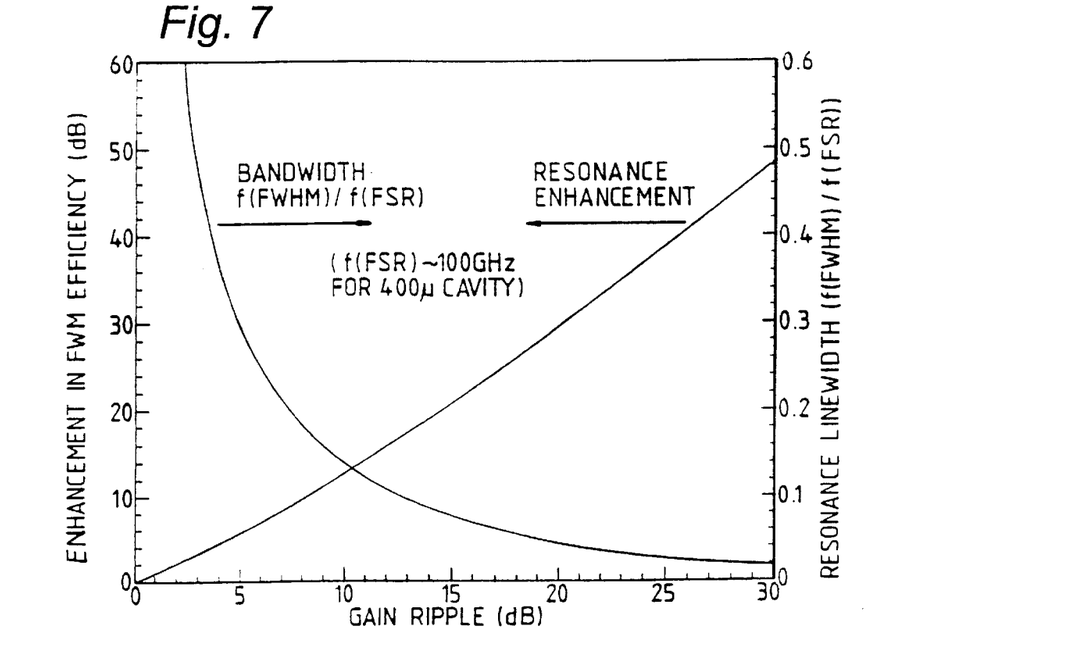
FIG. 7 shows the theoretical variation of the resonance enhancement and the bandwidth of cavity-enhanced NDFWM with gain ripple.

The narrow bandwidth of the resonance enhancement clearly places a considerable restriction on the usefulness of the effect. Equation (5) shows, however, that there is a trade-off between the resonance bandwidth and the magnitude of the enhancement, and FIG. 7 shows the dependence of the peak resonance enhancement and of the resonance FWHM (as a fraction of $\Delta f_{FSR}$) on the gain ripple. The point where gain ripple=0 corresponds to the case of a TWA with gain g. The figure shows that, in order to obtain a substantial enhancement, say>10, the resonance linewidth would need to be less than 0.18 $\Delta f_{FSR}$ (~15 GHx for a 500 $\mu$m device). In the present case, $\Delta f(\text{FWHM})/\Delta f_{FSR}$ lies in the range 0.033–0.06, corresponding to a resonance enhancement of 250–2000, which is consistent with the value of deduced in the previous action.

The experiments described have shown that extremely large enhancements in the efficiency of wavelength translation of NDFWM may be obtained using cavity-enhancement. Under the experimental conditions, an increase of approximately three orders of magnitude was observed in the NDFWM efficiency, for modest pump powers, for pump-probe detunings of up to 0.9 THz (9.2 nm) phase conjugate.

The usefulness of the effect is, however, limited by the following considerations: (1) the bandwidth for injection-locking is small, typically a few GHz, and therefore requires high stability in the pump and mixing devices. In addition, with two optical inputs, there are regimes in which the injection-locking becomes unstable, when the device tries, in effect, to look to two signals simultaneously. (2) The bandwidth for resonance enhancement is also small. In the measurement, this bandwidth was found to be as small as 2.8 GHz (FWHM). There is a trade-off between the resonance bandwidth and the enhancement obtained, and it is predicted that to obtain a factor of 10 increase in the NDFWM efficiency (compared with that for a travelling wave amplifier) one would be restricted to a bandwidth of ~15 GHz. This not only means that the wavelength of the input signal needs to be finely tunable and stable, but that the maximum bit rate for signals which are to be phase conjugated is limited to ~15 Gbit/s.

These problems can be overcome by using a semiconductor optical amplifier (such as a TWA) which has little cavity enhancement. The main difficulties then encountered lie in obtaining sufficient power and signal-to-background ratio in the phase conjugate signal. Since NDFWM is highly non-linear, these two quantities are strongly dependent on the powers of pump and signal beams within the TWA. To determine the optimum working conditions, these two parameters were measured as a function of (a) the gain of the TWA, and (b) the optical input power.

Figure 12:
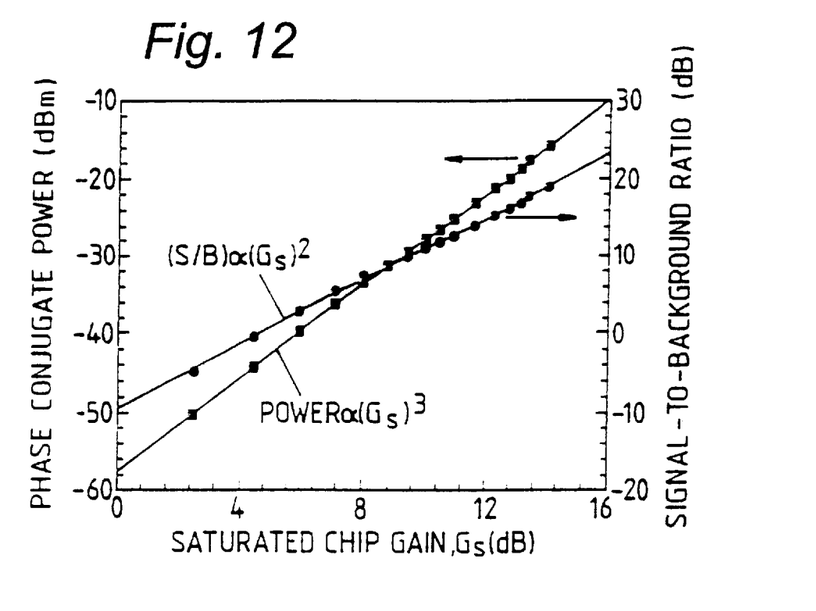
FIG. 12 shows the power of the phase conjugate signal and signal-to-background ratio as a function of the chip gain of a travelling wave amplifier (TWA)

FIG. 12 shows the phase conjugate power (measured at the output facet) and the signal-to-background ratio (measured by optical spectrum analyser with 0.1 nm resolution) as a function of the chip gain, for constant input power of +4.8 dBm (total fibre power, pump+signal). The phase conjugate power increases as the cube of the gain of the TWA, giving up to −16 dBm at high injection currents. The signal-to-background ration also increases strongly with the gain, but as the square of the gain. At the highest gains, the ratio is close to 20 dB. The signal-to-background increases less rapidly with the gain than the phase conjugate power owing to the linear dependence of the background spontaneous emission on the gain.

Figure 13:
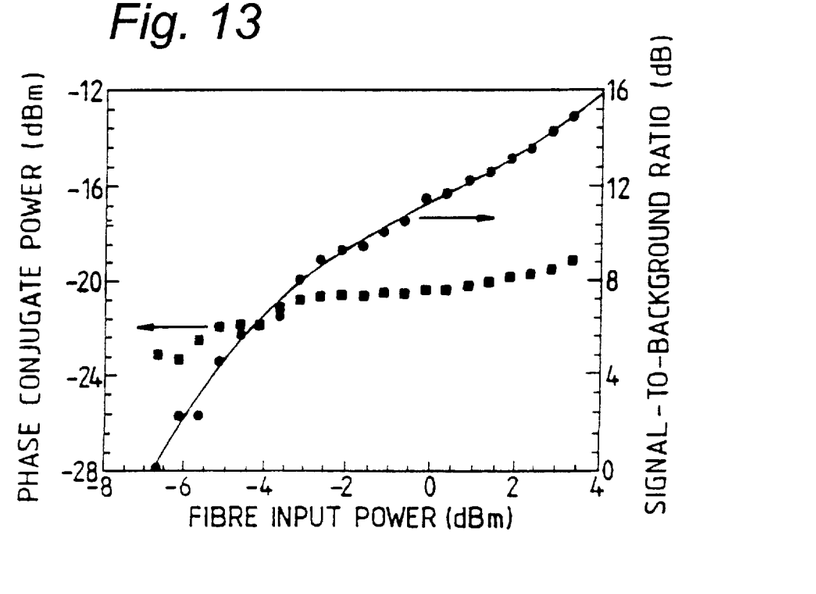
FIG. 13 shows phase conjugate power and signal-to-background ratio as a function of the total fibre input power (pump+signal). (The curve is a guide to the eye).

The dependence of the phase conjugate power and the signal-to-background ration on the input power is shown in FIG. 13 for constant TWA injection current of 250 mA (the ratio between pump and signal input power being hold constant). Surprisingly, the phase conjugate power level is quite insensitive to the input power. This, however, may be explained by the small change in the output power of the TWA under strong saturation. The input power, however, does have a strong effect on the signal-to-background ratio. This increases sharply with increasing input power, owing to the reduction in background spontaneous emission. This is an important consideration when attempting to minimise the noise introduced in the phase conjugation.

Figure 8:
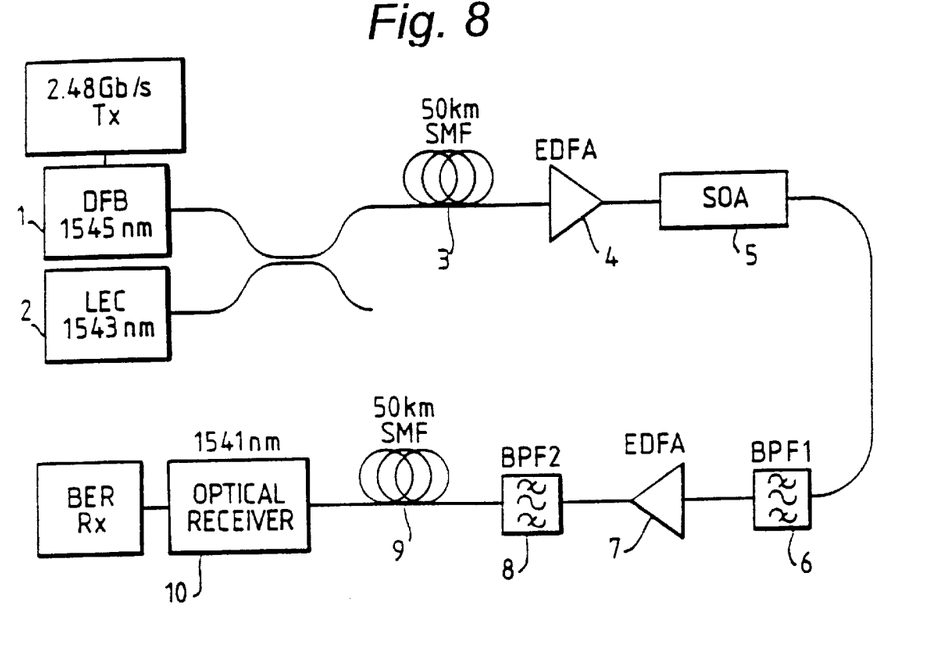
FIGS. 8–8a show the experimental arrangement for an embodiment of the invention.

An embodiment of the present invention will now be described in which FWM in a semiconductor optical amplifier (SOA) is employed to compensate for dispersion in an optical communications system. With reference to FIG. 8, a DFB laser 1 is used as the transmitter, directly modulated with a 2.488 Gbit/s pseudo-random NRZ $2^{15}$-1 pattern. The DFB laser 1 has a wavelength of $\lambda_s$=1544.7 nm. The bias and modulation of the DFP 1 were chosen to give good extinction ratio but, consequently, large chirp. The signal is combined at the transmitter end of the system with CW light from a pump laser 2, a long external cavity (LEC) laser operating at $\lambda_p$=1543.1 nm. The combined pump and signal is transmitted across 50 km normal-dispersion single-mode fibre 3, with a dispersion of 17 ps/nm. km at the signal wavelength. After amplification by an Erbium-doped fibre amplifier 4 (EDFA), the light was coupled into an SOA 5. The SOA is an etched-mesa buried hetrostructure device with an active layer of InGaAsP and both facets anti-reflection coated to less than $10^{-3}$ reflectivity. The SOA is operated at high injection current (300 mA), but the gain is saturated by the injected light with less than 1 dB residual Fabry-Perot ripple. The phase-conjugate signal is generated by NDFWM within the SOA, with a wavelength given by $\lambda_{PC}=(2\lambda_p^{-1}-\lambda_s^{-1})^{-1}$=1541.4 nm. An optical bandpass filter 6 (1.3 nm bandwidth) follows the SOA and allows only the phase-conjugate signal to be transmitted. This signal is amplified by a further EDFA 7 and further filtered by filter 8 (0.6 nm filter) then transmitted across a second 50 km length of single-mode fibre 9. The signal is detected using a PIN-FET optical receiver 10.

Figure 9:
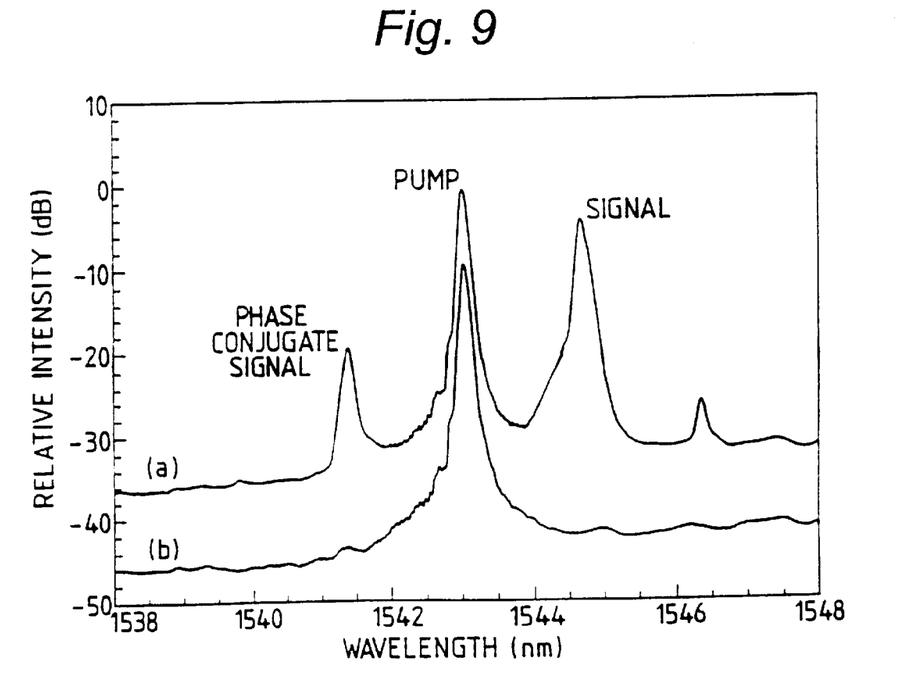
FIG. 9 shows optical spectra measured at the output of the SOA shown in FIG. 8, (a) with the DFB signal, and (b) without the DFB signal (offset by −10 dB)

Spectra at the output of the SOA are shown in FIG. 9, (a) with and (b) without the signal beam. With the signal and pump both present and with polarisations aligned, the phase-conjugate signal at 1541.4 nm is generated, with the inverted spectral profile of the DFB signal beam. The fibre input powers of the pump and signal beams into the SOA are +2.7 dBm and −4.1 dBm respectively. The background to the spectra is from amplified spontaneous emission from both the EDFA and the SOA and causes a reduction in the signal-to-noise ratio. In order to maximise both the signal-to-noise ratio and conversion efficiency the SOA is operated with high gain and moderately high input optical power. Taking into account the coupling loss into and out of the SOA, the conversion efficiency of the phase conjugation (i.e. ratio of the power of the phase conjugate beam at the output facet to signal power coupled into the SOA) is +2.4 dB, with a phase-conjugate of −5.6 dBm at the output facet of the SOA. This conversion efficiency is at least 20 dB greater than using DSF, and can be further increased by using a SOA with higher output power.

Figure 10A:
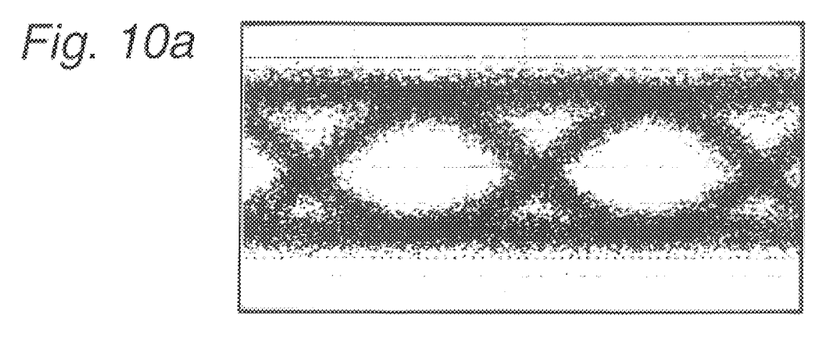
FIGS. 10(a)–10(c) show eye diagrams for the arrangement of FIG. 8 for (a) the back-to-back arrangement, (b) 100 km transmission without dispersion compensation, and (c) 100 km transmission with dispersion compensation (measurements were made using a 2.5 Gbit/s optical receiver, with −26 dBm received power)
Figure 10B:
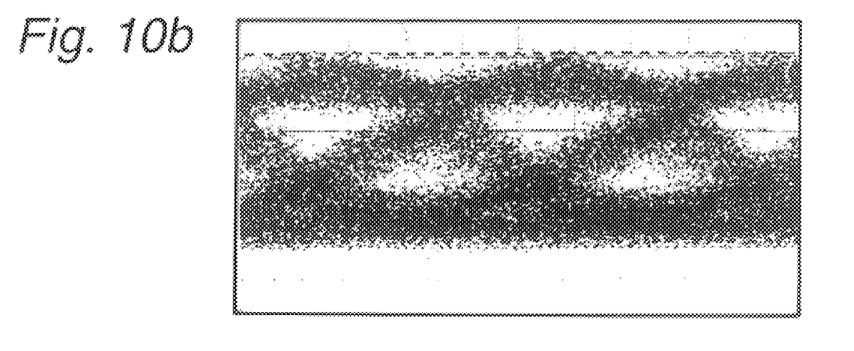
Figure 10C:
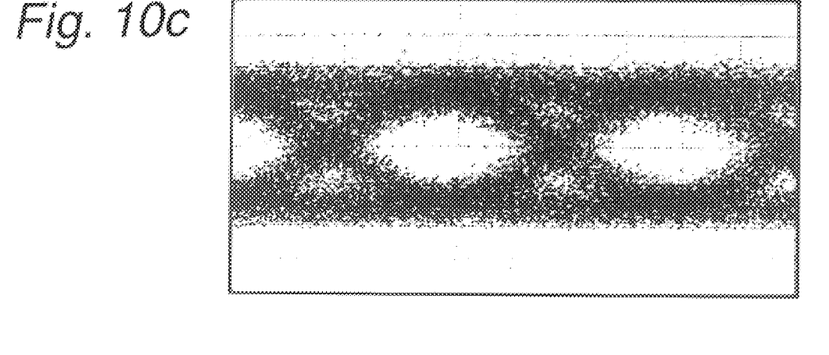

The effect of the dispersion compensation is clearly seen by comparison of the eye diagrams of FIG. 10, where (a), (b) and (c) correspond to the back-to-back measurement, and 100 km transmission without and with dispersion compensation, respectively. The figures are all taken from the receiver output with −26 dBm received optical power. The effects of fibre chromatic dispersion are evident from the distortion of the eye diagram (b), but the clean eye is completely recovered by the dispersion compensation (FIG. (c)).

Figure 11:
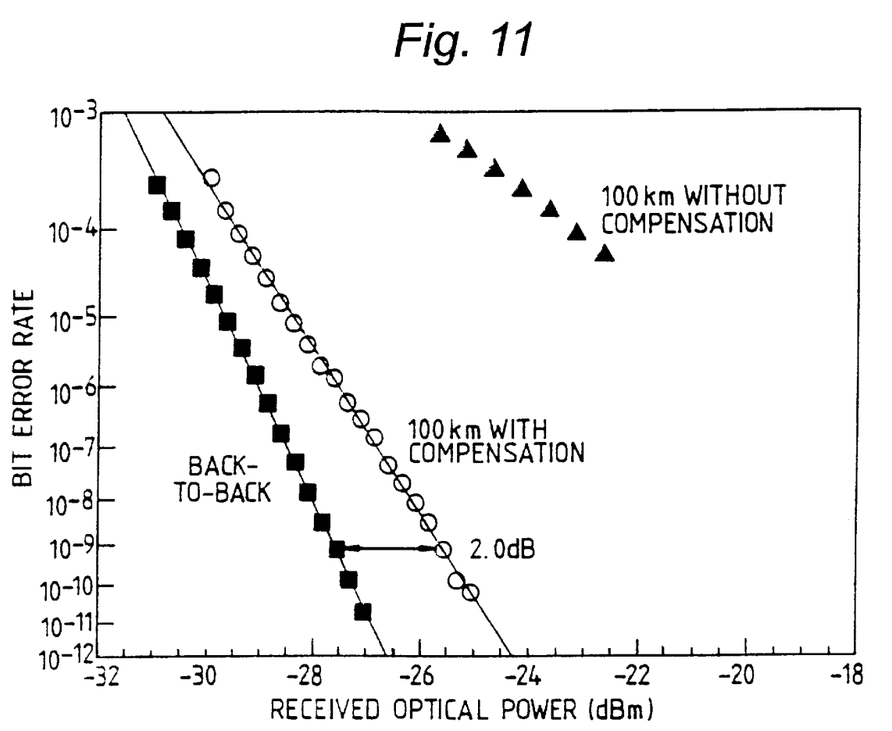
FIG. 11 shows bit error rate curves for the back-to-back arrangement, 100 km transmission without dispersion compensation, and 100 km transmission with dispersion compensation 2.488 Gbit/s ($2^{15}$−1) NRZ pseudo-random sequence.

Bit error rate (BER) measurements were performed for back-to-back transmission, and 100 km transmission with and without dispersion compensation, and the results are shown in FIG. 11. The back-to-back measurement, with the DFB signal directly into the receiver, shows a sensitivity of −27.5 dBm. The inclusion of a 0.6 nm bandpass filter results in a power penalty of less than 0.1 dB. Transmission of the DFB signal over 100 km without compensation (with a single EDFA at the transmitter) results in a considerable dispersion penalty, and BERs as low as $10^{-9}$ could not be achieved. A similar eye diagram and BER characteristic were obtained using the arrangement of FIG. 8, but with the filters tuned to transmit the DFB signal. With dispersion compensation, a dramatic improvement in the BER characteristic is seen, with $10^{-9}$ BER at −25.5 dBm. The 2 dB penalty results both from a reduction in extinction ratio and the introduction of signal-spontaneous beat noise, both arising from the introduction of amplifier spontaneous emission.

Thus chromatic dispersion compensation using optical phase conjugation in a semiconductor optical amplifier has removed the dispersion penalty in the transmission of a directly-modulated 2.5 Gbit/s signal at 1.5 $\mu$m over 100 km of normal dispersion fibre. The efficiency of the phase conjugation is high at +2.4 dB, despite the lack of cavity enhancement.

Figure 8A:
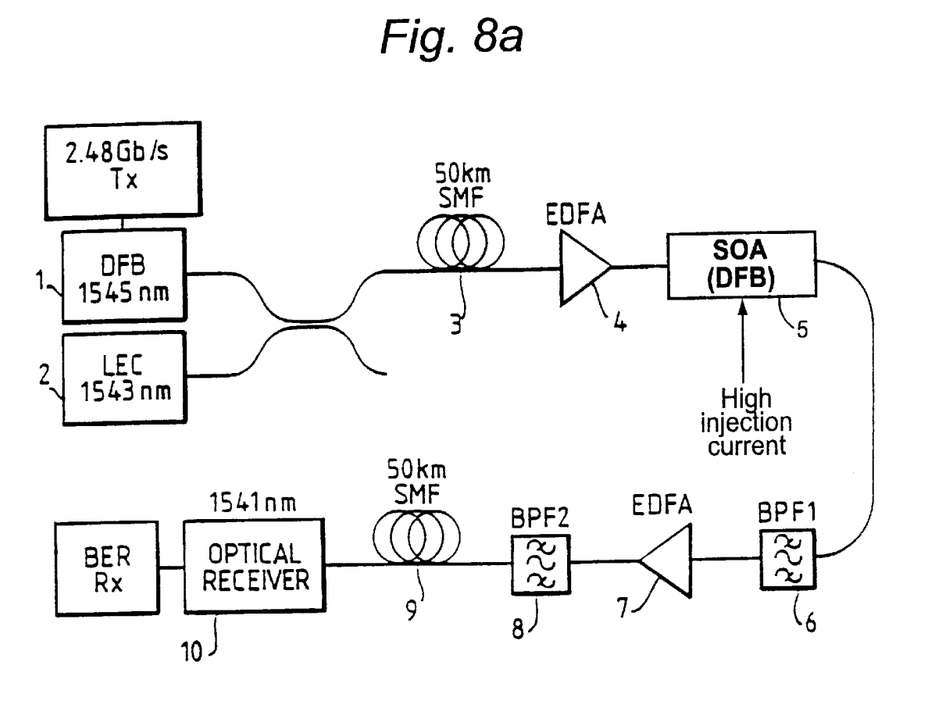

In an alternative embodiment (FIG. 8(a)) the SOA 5 is provided by a DFB laser having a wavelength of 1543 nm, thus allowing the pump laser 2 to be dispensed with. In this embodiment the pump radiation at 1543 nm is generated within the SOA 5. Again, in order to maximise the efficiency of phase conjugation the SOA (in this case a DFB) is operated to provide maximum output power, i.e. with a high injection current, typically more than 10 times the threshold current. Furthermore the average power of the optical signal injected into the SOA 5 is limited to a level such that the degree of gain modulation caused in the SOA is small, typically less than 1 dB.

We claim:

1. A method of compensating for dispersion in an optical communications system, the method comprising the steps of
   i) positioning a semiconductor optical amplifier between a first and a second length of optical fibre,
   ii) launching optical signals into the first length of optical fibre,
   iii) directing optical signals emerging from the first length of optical fibre into the semiconductor optical amplifier,
   iv) supplying optical pump radiation to the semiconductor optical amplifier so that the optical signals and the pump radiation interact within the semiconductor optical amplifier and generate the phase conjugate of the optical signals, and v) launching the phase conjugate optical signals into the second length of optical fibre.

2. A method as claimed in claim 1, wherein the variation in gain ripple of the semiconductor optical amplifier with wavelength is less than 5 dB.

3. A method as claimed in claim 1, wherein the reflectivity of the facets of the semiconductor optical amplifier is less than $10^{-3}$.

4. A method as claimed in claim 1, wherein the wavelength of the optical signals and the wavelength of the pump radiation differ by at least 1 nm.

5. A method as claimed in claim 1, wherein the wavelength of the optical signals and the wavelength of the pump radiation differ by less than 20 nm.

6. A method as claimed in claim 1, wherein the gain of the semiconductor optical amplifier is saturated by the pump radiation.

7. A method as claimed in claim 1, wherein the semiconductor optical amplifier is operated with a high injection current density.

8. A method as claimed in claim 7, wherein the semiconductor optical amplifier is operated with an injection current density of more than 5 kA/cm$^2$.

9. A method as claimed in claim 7, wherein the semiconductor optical amplifier is operated with an injection current density of more than 10 kA/cm$^2$.

10. A method as claimed in claim 1, wherein the optical pump radiation supplied to the semiconductor optical amplifier is generated within the semiconductor optical amplifier.

11. A method as claimed in claim 1, wherein the first and second lengths of optical fibre have similar levels of dispersion at the operating wavelength of the optical communications system.

12. A method as claimed in claim 1, wherein the optical signals and the pump radiation are arranged to be co-propagating within the semiconductor optical amplifier.

13. A method as claimed in claim 1, wherein the optical signals and the generated phase conjugate optical signals are co-propagating.

14. A method as claimed in claim 1, wherein in step iv) the optical pump radiation is supplied to the semiconductor optical amplifier from a pump source which is co-located with the semiconductor optical amplifier.

15. An optical communications system comprising:
a transmission path including a first optical fiber and a second optical fiber, an optical signal source for launching optical signals into the first optical fiber, an optical pump source for generating pump radiation, and a semiconductor optical amplifier having an input from the first optical fiber and an output to the second optical fiber, wherein, the semiconductor optical amplifier receives the pump radiation and the optical signals, after said signals have propagated through the first optical fiber, and generates phase conjugate replicas of the optical signals, which replicas are launched into the second optical fiber.

16. An optical communications system as claimed in claim 15, wherein both the semiconductor optical amplifier and the optical pump source are comprised by a semiconductor device having wavelength selective feedback means.

17. An optical communications system as claimed in claim 16, wherein said semiconductor device Is a distributed feedback laser.

18. An optical communication system as claimed in claim 15, further comprising an optical filter for filtering the remnant optical signals and pump radiation from the output of the semiconductor optical amplifier before it is launched into the second optical fibre.

19. An optical communications system, comprising:
a first length of optical fiber;
a second length of optical fiber;
a semiconductor optical amplifier disposed between said first and second optical fibers and operatively connecting said first optical fiber to said second optical fiber;
an optical pump source providing pump radiation to said semiconductor optical amplifier; and
an optical signal source launching optical signals into said first optical fiber;
wherein said semiconductor optical amplifier receives said optical signals from said first optical fiber and pump radiation from said optical pump source to generate a phase conjugate of the optical signals, said semiconductor optical amplifier further launching said phase conjugate into said second optical fiber.

20. The optical communications system of claim 19, further comprising:
an optical filter for filtering unwanted optical signals and pump radiation from an output of said semiconductor optical amplifier before launching of said phase conjugate into said second optical fiber.

* * * * *